United States Patent
Tai

(10) Patent No.: US 9,791,488 B2
(45) Date of Patent: Oct. 17, 2017

(54) SENSOR AND METHOD OF SENSING A VALUE OF A PARAMETER

(71) Applicant: TAIWAN SEMICONDUCTOR MANUFACTURING COMPANY, LTD., Hsinchu (TW)

(72) Inventor: Chia Liang Tai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 320 days.

(21) Appl. No.: 14/340,246

(22) Filed: Jul. 24, 2014

(65) Prior Publication Data

US 2014/0333330 A1    Nov. 13, 2014

Related U.S. Application Data

(63) Continuation-in-part of application No. 13/895,971, filed on May 16, 2013, now Pat. No. 8,959,994.

(60) Provisional application No. 61/799,544, filed on Mar. 15, 2013.

(51) Int. Cl.
G01C 21/00  (2006.01)
G01K 7/00   (2006.01)
G01R 27/26  (2006.01)
G01K 7/01   (2006.01)

(52) U.S. Cl.
CPC ........... *G01R 27/2605* (2013.01); *G01K 7/01* (2013.01); *G01K 2219/00* (2013.01)

(58) Field of Classification Search
None
See application file for complete search history.

(56) References Cited

U.S. PATENT DOCUMENTS

| | | | |
|---|---|---|---|
| 6,356,070 B1* | 3/2002 | Seils | G01D 3/028 324/207.12 |
| 7,565,258 B2 | 7/2009 | Duarte | |
| 7,859,314 B2* | 12/2010 | Rutkowski | H03K 17/166 326/83 |
| 8,136,987 B2 | 3/2012 | Luria et al. | |
| 8,167,485 B2* | 5/2012 | Lin | G01K 7/015 327/512 |

(Continued)

OTHER PUBLICATIONS

Lakdawala, Hasnain et al., "A 1.05 V 1.6 mW, 0.45 C 3 Resolution Based Temperature Sensor with Parasitic Resistance Compensation in 32 nm Digital CMOS Process", IEEE Journal of Solid State Circuits, vol. 44, No. 12, Dec. 2009, pp. 3621-3630.

*Primary Examiner* — Jermaine Jenkins
(74) *Attorney, Agent, or Firm* — Hauptman Ham, LLP

(57) ABSTRACT

A sensor for sensing a parameter includes a capacitor, a switch and a comparator. The capacitor is configured to be charged or discharged by at least one of a first current signal or a second current signal. The switch is configured to selectively connect or disconnect the first current signal and the capacitor in response to a feedback signal. The comparator is coupled with the capacitor and configured to output an output voltage based on a comparison of a capacitor voltage of the capacitor to a reference voltage. The first current signal is independent of the parameter, and the second current signal is dependent on the parameter. The output voltage defines the feedback signal and is indicative of a value of the parameter detected by the sensor.

20 Claims, 12 Drawing Sheets

(56) References Cited

U.S. PATENT DOCUMENTS

| | | | | |
|---|---|---|---|---|
| 8,222,940 B2* | 7/2012 | Kashmiri | ............... | H03L 1/022 327/150 |
| 8,262,286 B2* | 9/2012 | Peterson | ................. | G01K 7/01 327/512 |
| 8,596,864 B2* | 12/2013 | Peterson | ................. | G01K 7/01 374/170 |
| 8,959,994 B2* | 2/2015 | Tai | ........................ | G01K 7/34 73/184 |
| 9,039,278 B2* | 5/2015 | Chuang | ................... | G01K 1/02 324/609 |
| 2007/0126619 A1* | 6/2007 | McGrath | ................. | G01K 7/01 341/155 |
| 2010/0164552 A1 | 7/2010 | Luria et al. | | |
| 2011/0200070 A1 | 8/2011 | Makinwa et al. | | |

\* cited by examiner

SENSOR AND METHOD OF SENSING A VALUE OF A PARAMETER

PRIORITY CLAIM

The present application is a continuation-in-part of U.S. application Ser. No. 13/895,971, filed May 16, 2013, which claims the priority of U.S. Provisional Application No. 61/799,544, filed Mar. 15, 2013, the disclosures of which are incorporated herein by reference in their entireties.

BACKGROUND

Integrated circuits (ICs) typically generate heat when powered by an electric source such as a power supply. Overheating causes damage to the IC. Increases in clock speed, and device activity and the number of devices increases heating of the IC. A thermal management device employing a thermal sensor is typically used to prevent ICs from overheating. The thermal sensor detects a temperature of the IC. Analog circuitry is used to detect the temperature of the IC, and voltage and current characteristics are changed depending upon the temperature of the IC.

An output of the thermal sensor includes a temperature-independent (fixed reference) signal and a temperature-dependent signal and is input to an analog-to-digital converter (ADC) and transformed from voltage-to-frequency, voltage-to-voltage, current-to-voltage, and current-to-time based on a temperature detected by the thermal sensor. The transformed signals are compared with each other to determine a ratio of the temperature-dependent signal over the temperature-independent signal. A linear transfer of voltage-to-frequency, for example, is a challenge due to sensitivity to process variation. In some existing methods, sigma-delta ADC's are used and are based on sigma-delta modulation (SDM). The sigma-delta ADCs typically include a sigma-delta modulator and a digital decimation filter. The sigma-delta modulator includes an integrator, a quantizer, a loop filter, and a feedback path including a digital-to-analog converter (DAC) which performs digital-to-analog conversion based on a reference signal Vref. The output of the DAC is subtracted from the input signal at the adder and an output of the quantizer is processed in the digital decimation filter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
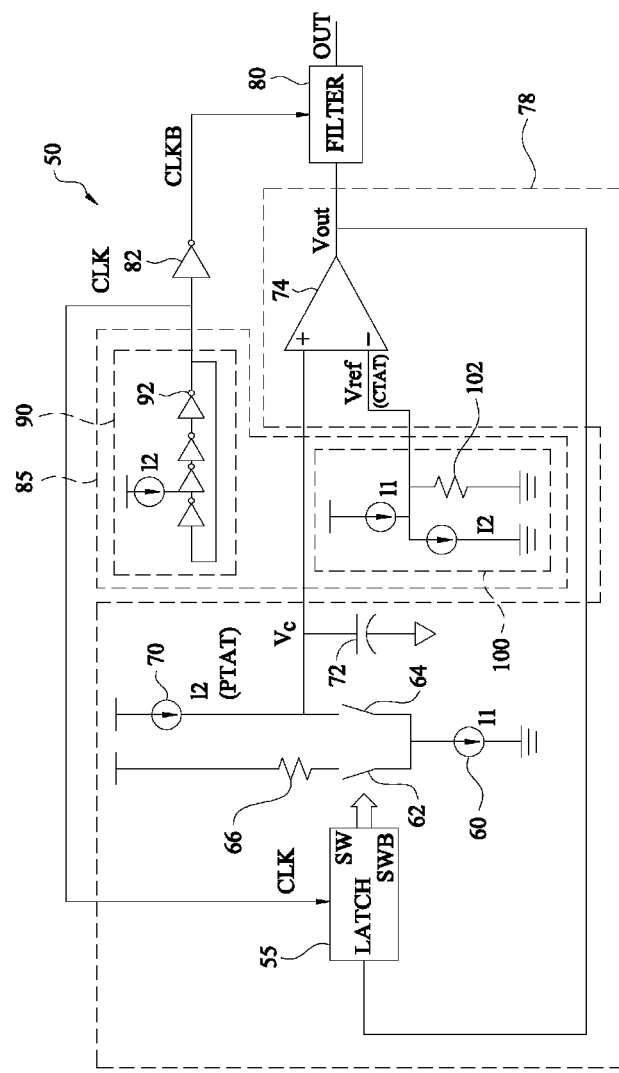
FIG. 1 is a block diagram of a thermal sensor in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such a description includes embodiments in which the first and second elements are directly connected or coupled to each other, and also includes embodiments in which the first and second elements are indirectly connected or coupled to each other with one or more other intervening elements in between. In the following description, a node or line and a corresponding signal on the node or line are commonly referred to using the node name. For example, VDD is used interchangeably herein to denote both a power supply voltage node and a power supply voltage on the node.

Some embodiments of the present disclosure provide a compact thermal sensor for multi-core processor applications in advanced processes such as 20 nanometer (nm) and 16 nanometer processes. The thermal sensor is not limited to being used with only advanced processes and is applicable to other processes, as suitable. The thermal sensor employs a current-to-voltage modulation method for translating a temperature-dependent current signal to a digitized output. The temperature-dependent current signal is suitable for multi-point detection application in which thermal sensors are arranged at various locations in an IC for monitoring a thermal distribution among different blocks in the IC.

FIG. 1 is a block diagram of a thermal sensor 50 in accordance with one or more embodiments. The thermal sensor 50 includes a latch 55, a first current source 60, a first switch device 62, a second switch device 64, a resistor 66, a second current source 70 and a capacitor 72. The thermal sensor 50 further includes a comparator 74, a digital filter 80 and an inverter 82. The thermal sensor 50 further includes a temperature control circuit 85 that includes an oscillator 90 and a reference voltage control circuit 100. The latch 55, the first current source 60, the first switch device 62, the second switch device 64, the resistor 66, the second current source 70, the capacitor 72 and the comparator 74 together define a converter 78.

The latch 55 is in communication with a first switch path corresponding to the first switch device 62 and a second switch path corresponding to the second switch 64 and is configured to selectively connect or disconnect the first and second current sources 60 and 70 based on an input to the latch. Specifically, the latch 55 outputs a signal SWB to control the first switch device 62, and a signal SW to control the second switch device 64.

The first switch device 62 is coupled between the resistor 66 and the first current source 60 forming the first switch path, and the second switch device 64 is also coupled between the first current source 60, the second current source 70 and the capacitor 72 forming the second switch path. The first current source 60 is configured to supply a first current signal (I1) which is a temperature-independent signal (i.e., a reference signal). The first current signal I1 is used to discharge the capacitor 72 based on a difference between a second current signal I2 (discussed below) and the first current signal I1.

The second current source 70 is coupled to the capacitor 72 and is configured to supply the second current signal (I2). The second current signal I2 is a temperature-dependent signal (i.e., proportional to absolute temperature (PTAT)) and is indicative of the temperature detected by the thermal sensor 50. In one or more embodiments, the second current source 70 is a temperature sensor, or coupled to a temperature sensor, that detects a temperature and generates the second current signal I2 dependent on the detected temperature. An example of a temperature sensor used in at least one embodiment is a silicon-based temperature sensor. The second current signal (I2) is used to charge the capacitor 72. The capacitor 72 is also coupled with a first input of the comparator 74.

The temperature control circuit 85 includes an oscillator 90 comprising a delay cell 92 including a plurality of series-connected inverters coupled with the second current source 70. The oscillator 90 has an output that is coupled to an input of the inverter 82 and an output of the inverter 82 is coupled with the digital filter 80. The oscillator 90 is a current-driven oscillator that delays an output clock signal based on the received second current signal I2 of the second current source 70. Further, the oscillator 90 also sends a delayed clock signal CLK back to the latch 55 to control a timing of the latch 55 for opening and closing the first and second switch paths based on a clock rate of the clock signal CLK. The clock signal CLK is also supplied from the oscillator 90 to the inverter 82 that outputs an inverse of the clock signal CLK, i.e., a clock signal CLKB, to the digital filter 80 to control a timing of a counting operation in the digital filter 80.

Further, the reference voltage control circuit 100 includes a resistor 102 and the reference voltage control circuit 100 is coupled to a second input of the comparator 74. The reference voltage control circuit 100 determines and generates a reference voltage Vref to the second input of the comparator 74. According to one embodiment, the reference voltage is complementary to absolute temperature (CTAT), i.e., the reference voltage decreases substantially linearly as the temperature increases. The current signal through the resistor 102 is formed by subtracting the second current signal I2 from the first current signal I1, the resulting current is a CTAT current through the resistor 102 to generate voltage Vref (CTAT).

The comparator 74 is configured to compare the capacitor voltage Vc with the reference voltage Vref to generate an output voltage (Vout).

In an initial state of the thermal sensor 50, the latch 55 closes the first switch path (i.e., closes the first switch device 62) and opens the second switch path (i.e., opens the second switch device 64) to disconnect the first current source 60 from the capacitor 72, and pulls the first current signal I1 through the resistor 66. The second current source 70 supplies the second current signal I2 to charge the capacitor 72 to a capacitor voltage Vc. The capacitor voltage Vc is input into the comparator 74 and compared with the reference voltage Vref generated by the reference voltage control circuit 100. The comparator 74 then outputs the output voltage Vout as a feedback signal transmitted to the latch 55 for determining whether to charge or discharge the capacitor 72.

If the capacitor voltage Vc is higher than the reference voltage Vref, then the output voltage Vout of a logic high level "1" is sent to the latch 55 as the feedback signal, and the latch 55 selectively connects the first current source 60 (e.g., by opening the first switch device 62 and closing the second switch device 64) to discharge the capacitor 72 based on a difference between the second current signal I2 and the first current signal I1. According to one or more embodiments, charging and discharging of the capacitor 72 is a continuous current-to-voltage modulation process. The capacitor voltage Vc is increased or decreased based on the respective charge current (I2) and discharge current (I1 minus I2).

Further, according to one or more embodiments, pulse density u of the output voltage Vout is determined based on the following equation:

$$\frac{-(I1-I2)*t1}{T(\text{Discharging with time } t1)} + \frac{(I2)*(T-t1)}{T(\text{Charging with time}(T-t1))} = 0$$

where T corresponds to a repeat cycle time; t1 corresponds to the ON time of the output voltage Vout when the comparator 74 outputs a high logic level "1", and (T−t1) corresponds to the OFF time of the output voltage Vout when the comparator 74 outputs a low logic level "0". The pulse density u is a ratio of the ON time t1 to the cycle time T. By replacing t1/T with u in the above equation, the following relationship is obtained:

$$(I1-I2)*u=I2*(1-u), \text{ or } u=I2/I1.$$

In a specific example, T corresponds to 1024 clock pulses in a 10-bit system, u is a ratio of a total number of clock pulses corresponding to Vout at the high logic level "1" counted over the cycle time T divided by 1024. The pulse density u is the current ratio I2/I1.

Because the first current signal I1 is a temperature-independent signal and the second current signal I2 is a temperature-dependent signal that is indicative of the temperature detected by the thermal sensor 50, the pulse density u or ratio I2/I1 is also indicative of the detected temperature.

Further, the digital filter 80 counts a number of clock pulses corresponding to the ON time (t1) of the output voltage Vout during a counting window of a predetermined number of clock pulses, for example, 1024 clock pulses. The clock pulses have a clock rate determined by the clock signal CLKB supplied from the oscillator 90 and the inverter 82. In at least one embodiment, the digital filter 80 is a down-counter that decrements a least significant bit (LSB) of the count and reads out the result. The readout OUT is the digitized pulse density representing the ratio (I2/I1) which indicates the temperature detected by the thermal sensor 50.

According to other embodiments, the second current signal I2 is complementary to the absolute temperature (CTAT) and the reference voltage Vref is proportional to the absolute temperature (PTAT). In these embodiments, the digital filter 80 is an up-counter that increments the LSB of the count.

After 1024 clock cycles, the total number of clock pulses corresponding to the ON time (t1) of the output voltage Vout is outputted as the readout OUT that indicates the ratio of I2/I1 (i.e., the temperature detected by the thermal sensor 50), and the digital filter 80 is reset to repeat the counting operation. In a particular example with a detected temperature range from −25° C. to 125° C., if the temperature detected by the thermal sensor 50 is 75° C., then the second (CTAT) current signal I2 is 1/3 of the first current signal I1, the digital filter 80 counts 1/3 of the 1024 counts (i.e., about −341 counts) as corresponding to the ON time of the output voltage Vout and outputs an appropriate readout OUT representing the counted number and also representing the temperature detected by the thermal sensor 50.

The temperature control circuit 85 according to some embodiments of the present disclosure, provides ways to eliminate, or at least reduce, excessive voltage swing and/or averaged level deviation of the capacitor voltage Vc by adjusting the capacitor voltage Vc and/or the reference voltage Vref according to temperature variations. The clock rate of the clock signal CLK provided by the oscillator 90 and the level of the reference voltage Vref are adjusted according to the detected temperature to provide control of analog performance and/or response time of the thermal sensor 50.

When charging or discharging of the capacitor 72, a deviation of the capacitor voltage Vc potentially causes current inaccuracy, especially in an advance process which adopts a low supply voltage. The temperature control circuit 85 in accordance with some embodiments eliminates, or at least reduces, variations of the capacitor voltage Vc to control the current accuracy.

Figure 2:
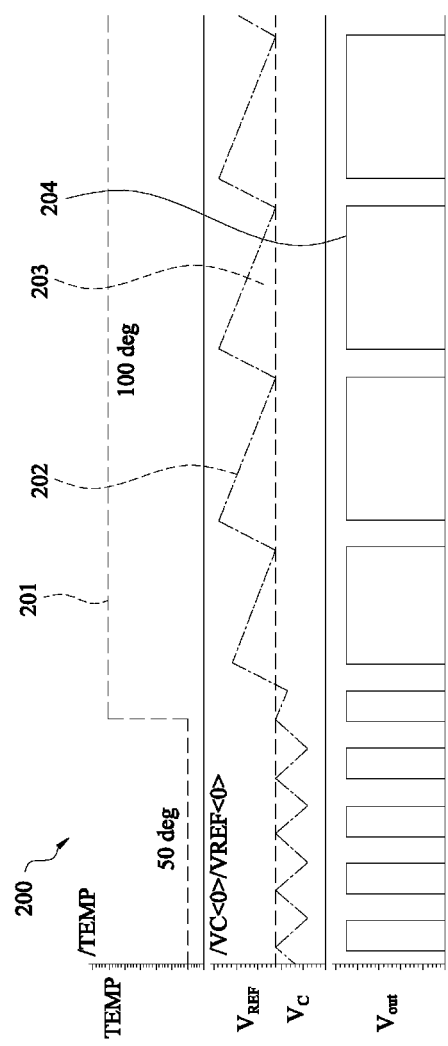
FIG. 2 is a timing diagram of operation of a thermal sensor without temperature adapted control.

FIG. 2 is a timing diagram 200 of operation of a thermal sensor without temperature adapted control. An example of a thermal sensor without temperature adapted control is the thermal sensor 50 without the temperature control circuit 85, and the reference voltage Vref has a fixed voltage level. In a waveform 201, the temperature (Temp) detected by the thermal sensor is shown at 50° C. and 100° C.

At 50° C., the capacitor voltage Vc shown as waveform 202 in comparison to the reference voltage Vref shown as waveform 203, and the output voltage Vout shown as waveform 204 includes pulses having a pulse density proportional to the ratio (I2/I1).

At 100° C., the capacitor voltage Vc has a different relationship with the reference voltage Vref; therefore, the output voltage Vout has a greater pulse density than that at 50° C., and the pulse density is proportional to the temperature variation.

The capacitor voltage Vc is different at the different temperatures. For example, at 100° C., the capacitor voltage Vc has a peak to peak voltage swing and an average voltage level which are higher than those at 50° C.

The following equation is implemented by the oscillator 90 in accordance with some embodiments to eliminate, or at least reduce, potential voltage swing issues of the capacitor voltage Vc of the capacitor 72:

$$Vc=I*(1/sC),$$

where I is the discharge/charge current of the capacitor 72 (e.g., the second current signal I2); s corresponds to the frequency of the current I; and C corresponds to the capacitance of the capacitor 72. In some embodiments, the discharge/charge current I of the capacitor 72 is a temperature-dependent current. According to one or more embodiments, the current I increases with the detected temperature (i.e., the current I is proportional to absolute temperature (PTAT)). Further, the capacitance C possibly varies with process, voltage, and/or temperature (PVT) variations.

Therefore, the capacitor voltage Vc is proportional to I/C. The capacitor voltage Vc is also proportional to 1/Fclk, where Fclk corresponds to a clock frequency (i.e., the clock rate) of the clock signal CLK generated by the oscillator 90 and supplied to the latch 55 which, in turn, controls discharging and charging of the capacitor 72. The oscillator 90 varies the clock rate Fclk according to the discharge/charge current I, i.e., according to the detected temperature. For example, in one or more embodiments, the oscillator 90 varies the clock rate Fclk such that $$Fclk=k*(I''/C''),$$

where k corresponds to a constant value; I'' corresponds to the current I (e.g., the second current signal I2 in the oscillator 90; and C'' corresponds to the capacitance in the delay cell 92 of the oscillator 90 and has the same PVT variation effects as the capacitance C of the capacitor 72. The resultant equation for Vc is as follows:

$$Vc=I/(Fclk)*C=I/(k*I''/C'')*C=k''$$

Thus, by using the oscillator 90 to vary the clock rate in accordance with the discharge/charge current I (i.e., in accordance with the detected temperature) according to one or more embodiments, the peak to peak voltage swing of the capacitor voltage Vc is kept constant (because k'' is a constant) regardless of PVT variations.

In the specific embodiment in FIG. 1, in the oscillator 90 of the temperature control circuit 85, the second current signal I2 of the second current source 70 is proportional to absolute temperature (PTAT) and is input into the delay cell 92 to adjust the clock rate of the clock signal CLK supplied to the latch 55. For example, when the detected temperature increases, the second current signal I2 also increases, and the oscillator 90 increases the clock rate Fclk of the clock signal CLK supplied to the latch 55. As a result, the latch 55 outputs the signals SWB and/or SW at the increased clock rate, causing the capacitor 72 to charge and discharge more frequently, which, in turn, keeps the peak to peak voltage swing of the capacitor voltage Vc constant despite the increased charging current, i.e., the increased second current signal I2. When the detected temperature decreases, the second current signal I2 decreases, the oscillator 90 decreases the clock rate Fclk, the latch 55 causes charging and discharging of the capacitor 72 less frequently and keeps the peak to peak voltage swing of the capacitor voltage Vc constant despite the decreased charging current, i.e., the decreased second current signal I2. Therefore, the peak to peak voltage swing of the capacitor voltage Vc of the capacitor 72 is maintained at a constant rate regardless of temperature variations, as described in more detail with respect to FIG. 3.

Figure 3:
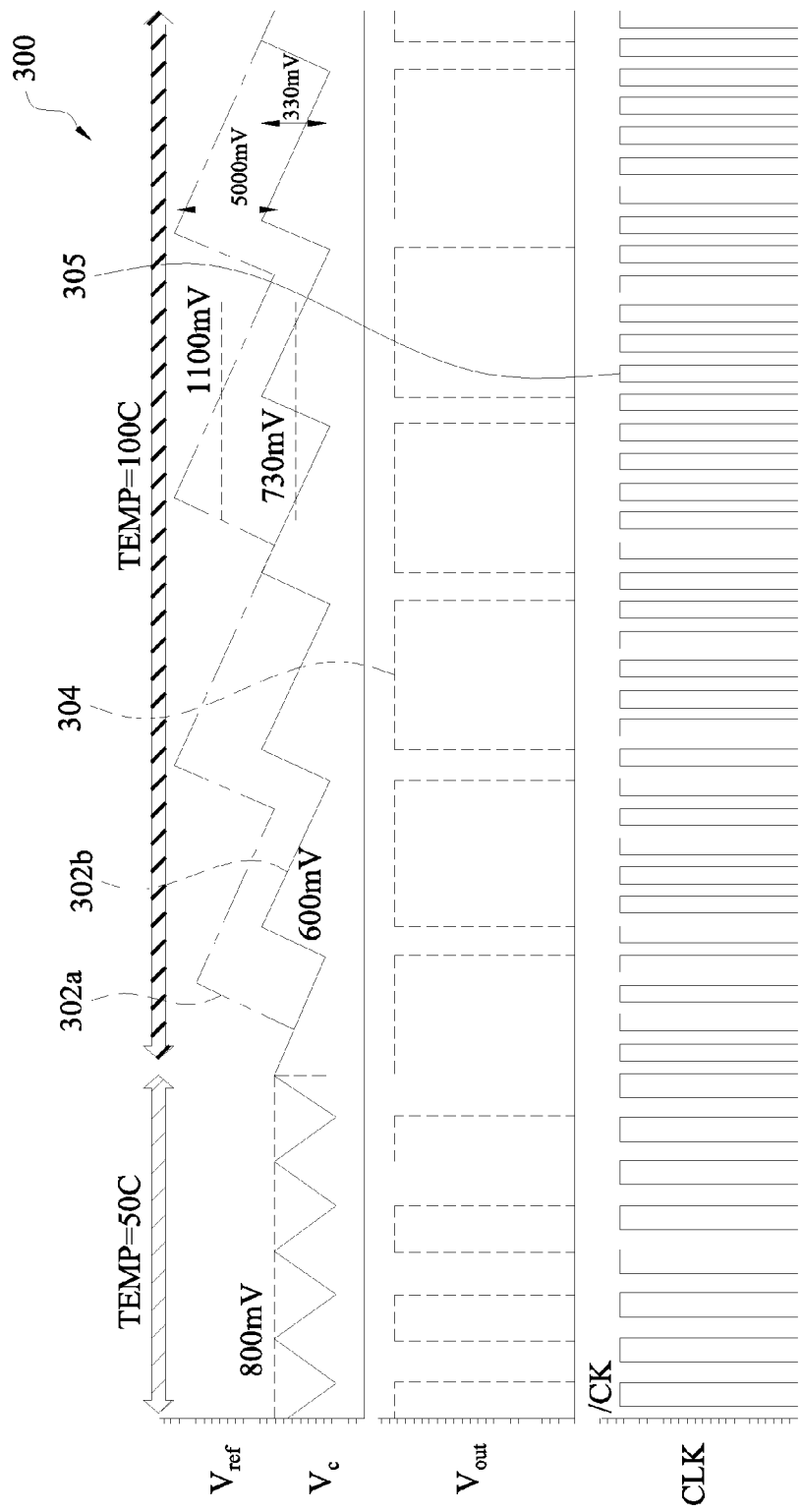
FIG. 3 is a timing diagram of operation of a thermal sensor with temperature adjusted control in accordance with one or more embodiments.

FIG. 3 is a timing diagram 300 of operation of the thermal sensor 50 with temperature adjusted control in accordance with one or more embodiments. By use of the oscillator 90, the peak to peak voltage swing of the capacitor voltage Vc is reduced at the input of the comparator 74, from 500 millivolts (mV) without compensation of the capacitor voltage Vc (as shown in waveform 302a when the oscillator 90 is not used) to about 330 mV (or better with further optimization) with compensation of the capacitor voltage Vc (as shown in waveform 302b when the oscillator 90 is used) at the detected temperature of 100° C.

Further, regarding the average voltage of the capacitor voltage Vc, by use of the reference voltage control circuit 100, the reference voltage Vref is proportional to m/temp, where m is a constant value. Therefore, the reference voltage Vref is lowered at higher detected temperatures. In the example in FIG. 3, the reference voltage Vref (shown in waveform 303) decreases from about 800 mV at 50° C. to about 600 mV at 100° C. The average level of the capacitor voltage Vc is decreased from about 1100 mV without compensation (i.e., when the reference voltage Vref is fixed) to about 730 mV with Vref control (i.e., when the reference voltage Vref is varied in accordance with the detected temperature). With the combined temperature adapted control provided by the oscillator 90 and the reference voltage control circuit 100, it is possible to keep the peak to peak voltage swing and average level of the capacitor voltage Vc constant, or with tolerable variations, across PVT variations to have good current accuracy and temperature detection performance.

In an example with a detected temperature range from −25° C. to 125° C., the pulse density u of the output voltage Vout (shown in waveform 304) at the detected temperature of 50° C. is about 50%, i.e., for every two clock pulses, there is one clock pulse corresponding to Vout at the high logic level "1." The pulse density u of the output voltage Vout at the detected temperature of 100° C. is about 83%, i.e., for every six clock pulses, there are five clock pulses corresponding to Vout at the high logic level "1." The pulse density u of the output voltage Vout is increased from about 50% at the detected temperature of 50° C. to about 83% at the detected temperature of 100° C.

Further, in at least one embodiment, the clock rate Fclk determined at the oscillator 90 increases at higher temperatures (shown in waveform 305), for example, from 20 megahertz (MHz) at the detected temperature of 50° C. to 30 megahertz (MHz) at the detected temperature of 100° C.; therefore, the response time at the latch 55 is also faster at higher temperatures, for example, the response time increases from 205 microseconds (μs) at the detected temperature of 50° C. to about 135 μs at the detected temperature of 100° C. The property that a thermal sensor responds faster at higher temperatures is an advantage in some embodiments.

Figure 4:
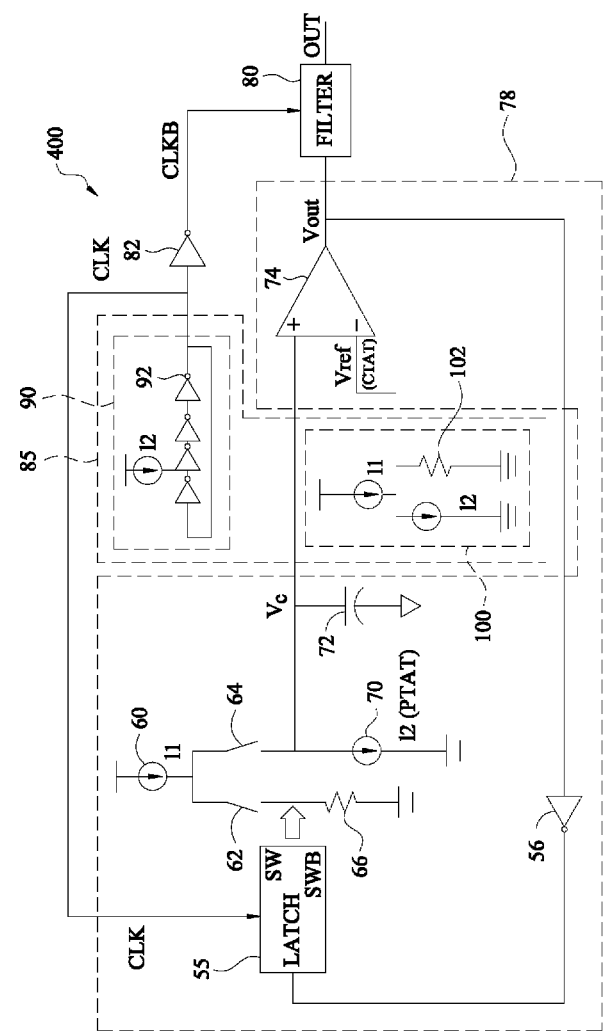
FIG. 4 is a block diagram of a thermal sensor in accordance with one or more embodiments.

FIG. 4 is a block diagram of a thermal sensor 400 in accordance with one or more alternative embodiments. The thermal sensor 400 includes the same elements as those of the thermal sensor 50 shown in FIG. 1; therefore a detailed description of these same elements is omitted. The configuration of the thermal sensor 400 is also similar to the thermal sensor 50 shown in FIG. 1, except the current (I1−I2) is used to charge the capacitor 72 and the second current signal I2 is used to discharge the capacitor 72.

In FIG. 4, if the output voltage Vout is a high logic level "1," a feedback signal is sent to the latch 55 via an inverter 56 and the second switch device 64 is opened and the capacitor 72 is discharged by the second current signal I2. If the logic level of the output voltage Vout is "0" then the feedback signal to the latch 55 via the inverter 56 is used to turn on (i.e., close) the second switch device 64 to connect the first current source 60 to the capacitor 72, and the capacitor 72 is charged by the current (I1−I2) which is the difference between the first current signal I1 of first current source 60 and the second current signal I2 of the second current source 70.

According to one or more embodiments, the second current signal I2 is proportional to the absolute temperature (PTAT) and the reference voltage Vref is complementary to the absolute temperature (CTAT) and the digital filter 80 decrements a count of the received clock pulses in accordance with the pulse density u of the output voltage Vout. According to other embodiments, the second current signal I2 is CTAT and the reference voltage is PTAT and the digital filter 80 increments the count of the received clock pulses accordance with the pulse density u of the output voltage Vout.

Figure 5A:
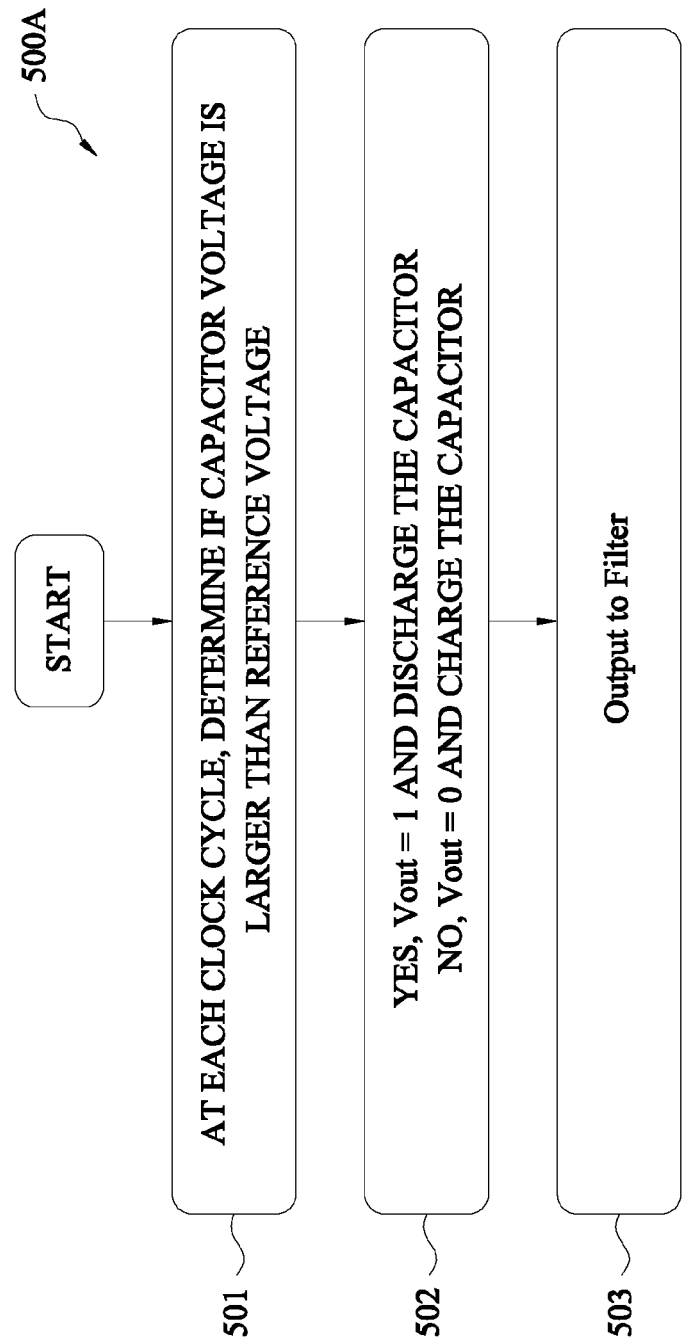
FIG. 5A is a process flow diagram of a method of operating a converter.
Figure 5B:
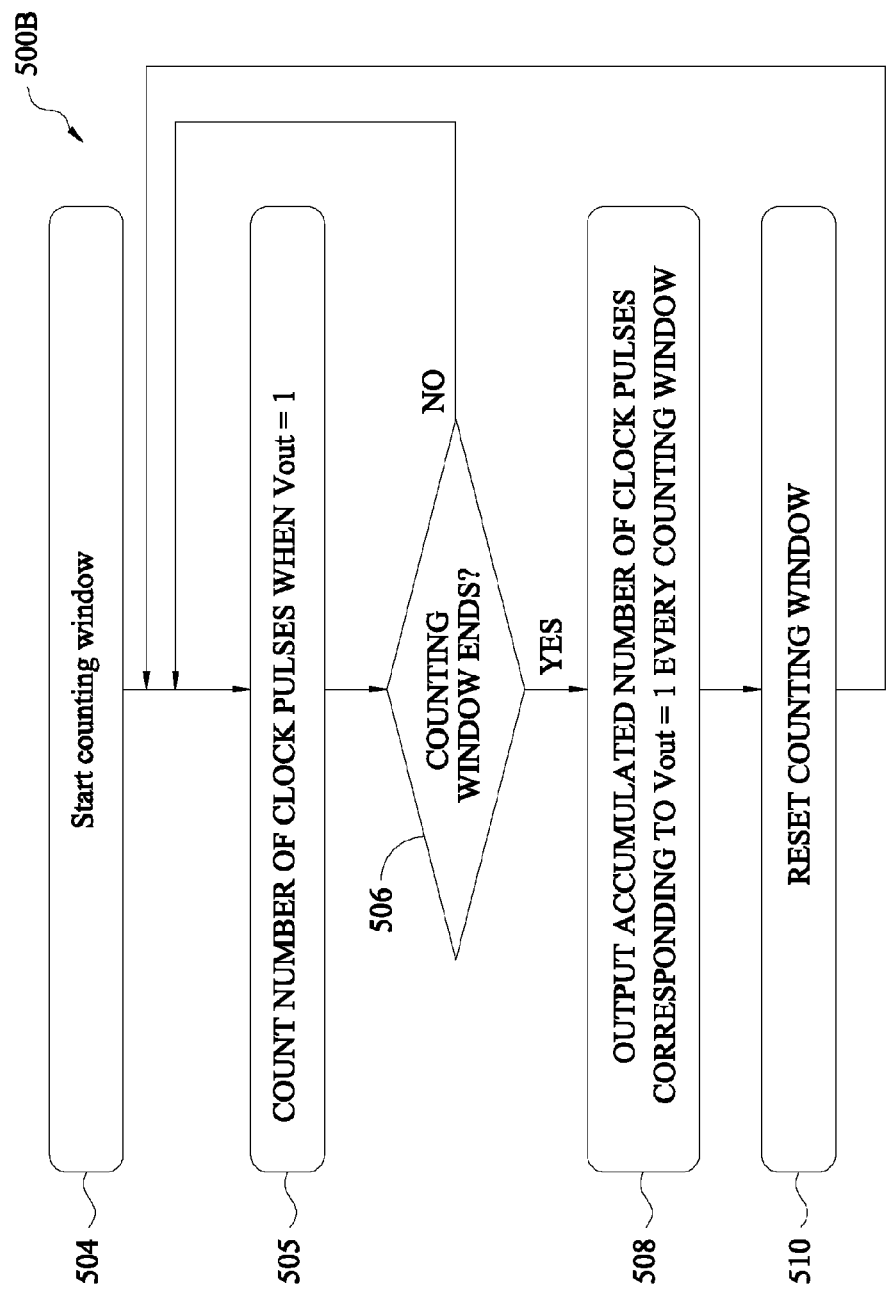
FIG. 5B is a process flow diagram of a method of operating a filter, in a thermal sensor in accordance with one or more embodiments.

FIG. 5A is a process flow diagram of a method 500A of operating a converter (for example, the converter 78 in FIG. 1 or FIG. 4), and FIG. 5B is a process flow diagram of a method 500B of operating a filter (for example, the filter 80 in FIG. 1 or FIG. 4), in a thermal sensor (for example, the thermal sensor 50 (FIG. 1) or the thermal sensor 400 (FIG. 4)) in accordance with one or more embodiments.

As illustrated in FIG. 5A, in operation 501, the converter 78 compares the capacitor voltage Vc of the capacitor 72 to the reference voltage Vref and determining, at each clock cycle, whether the capacitor voltage Vc is larger than the reference voltage Vref.

From operation 501, the process continues to operation 502, where if the capacitor voltage Vc is larger than the reference voltage Vref, the output voltage Vout is set to a logic high level "1" and the capacitor 72 is discharged. The discharging of the capacitor 72 includes connecting (FIG. 1)/disconnecting (FIG. 4) the first current source 60 to/from the capacitor 72 by closing (FIG. 1)/opening (FIG. 4) the second switch device 64. If the capacitor voltage Vc of the capacitor 72 is less than the reference voltage Vref, the output voltage Vout is set to a logic low level "0" and the capacitor 72 is charged. The charging of the capacitor 72 includes disconnecting (FIG. 1)/connecting (FIG. 4) the first current source 60 from/to the capacitor 72 by opening (FIG. 1)/closing (FIG. 4) the second switch device 64. The charge/discharge current (I) to increase/decrease the capacitor voltage Vc on the capacitor 72 is represented by the following equation:

$$I = -/+u*[I1-I2]+/-(1-u)*I2,$$

wherein u corresponds to the pulse density u of the output voltage Vout of the comparator 74, I1 corresponds to the first current signal of the first current source 60, and I2 corresponds to the second current signal of the second current source 70. In the thermal sensor 50 of FIG. 1, $I = -u*[I1-I2]+(1-u)*I2$, where $-u*[I1-I2]$ is the discharging current while $+(1-u)*I2$ is the charging current. In the thermal sensor 400 of FIG. 4, $I = +u*[I1-I2]-(1-u)*I2$, where $+u*[I1-I2]$ is the charging current while $-(1-u)*I2$ is the discharging current.

In operation 503, the output voltage $V_{OUT}$ is outputted from the converter 78 to the filter 80. In some embodiments, the converter 78 outputs the output voltage Vout, independently of the operation of the filter 80. For example, in one or more embodiments, the reset of a counting window of the filter 80 as described herein does not affect the described operation of the converter 78. Compared to other approaches where a converter is reset repeatedly, the independent operation of the converter 78 with respect to the filter 80 in a sensor in accordance with some embodiments improves accuracy and/or speed.

As illustrated in FIG. 5B, in operation 504, a counting window is started on the filter 80.

In operation 505, the filter 80 counts the number of clock pulses when the output voltage Vout has a logic high level "1," to digitize the pulse density u of the output voltage Vout from the converter 78. The filter 80 is a down-counter (when I2 is PTAT and Vref is CTAT) in some embodiments, or a up-counter (when I2 is CTAT and Vref is PTAT) in some embodiments. A specific example is given in FIG. 6 when I2 is CTAT, Vref is PTAT, and the digital filter 80 is a up-counter. Assuming that the temperature detected by the thermal sensor is 75° C., then the second (CTAT) current signal I2 is 1/3 of the first current signal I1. Because I2/I1 is 1/3, 1/3 of the 1024 clock pulses (i.e., about 341 pulses) correspond to the ON time of the output voltage Vout. The digital filter 80 counts up 341 counts from zero and outputs a readout OUT of 341 counts representing the detected temperature of 75° C. In another example (not shown), I2 is PTAT, Vref is CTAT, and the digital filter 80 is a down-counter. Assuming that the temperature detected by the thermal sensor is 75° C., then the second (PTAT) current signal I2 is 2/3 of the first current signal I1. Because I2/I1 is 2/3, 2/3 of the 1024 clock pulses (i.e., about 683 pulses) correspond to the ON time of the output voltage Vout. The digital filter 80 counts down 683 counts from 1024 and outputs the same readout OUT of 341 counts representing the detected temperature of 75° C. In both examples, the readout OUT is inverse proportional to the detected temperature.

The process proceeds to operation 506 to determine whether the counting window has ended. In some embodiments, the counting window includes 1024 clock pulses. Other sizes (i.e., numbers of clock pulses) of the counting window are within the scope of various embodiments. If the counting window has not ended (No at operation 506), the process returns to operation 505 and the filter 80 continues to count the number of clock pulses when the output voltage Vout has a logic high level "1."

If the counting window has ended (Yes at operation 506), the accumulated number of clock pulses corresponding to the logic high level "1" of the output voltage Vout is outputted at operation 508 as the readout OUT that indicates the detected temperature. The processes then resets the counting window at operation 510 and returns to operation 505. The described operation of the filter 80, including the counting window reset, is an example. Other configurations of the filter 80 are within the scope of various embodiments. For example, in at least one embodiment, the filter 80 is a Sinc filter in which a counting window reset is not performed.

Figure 7:
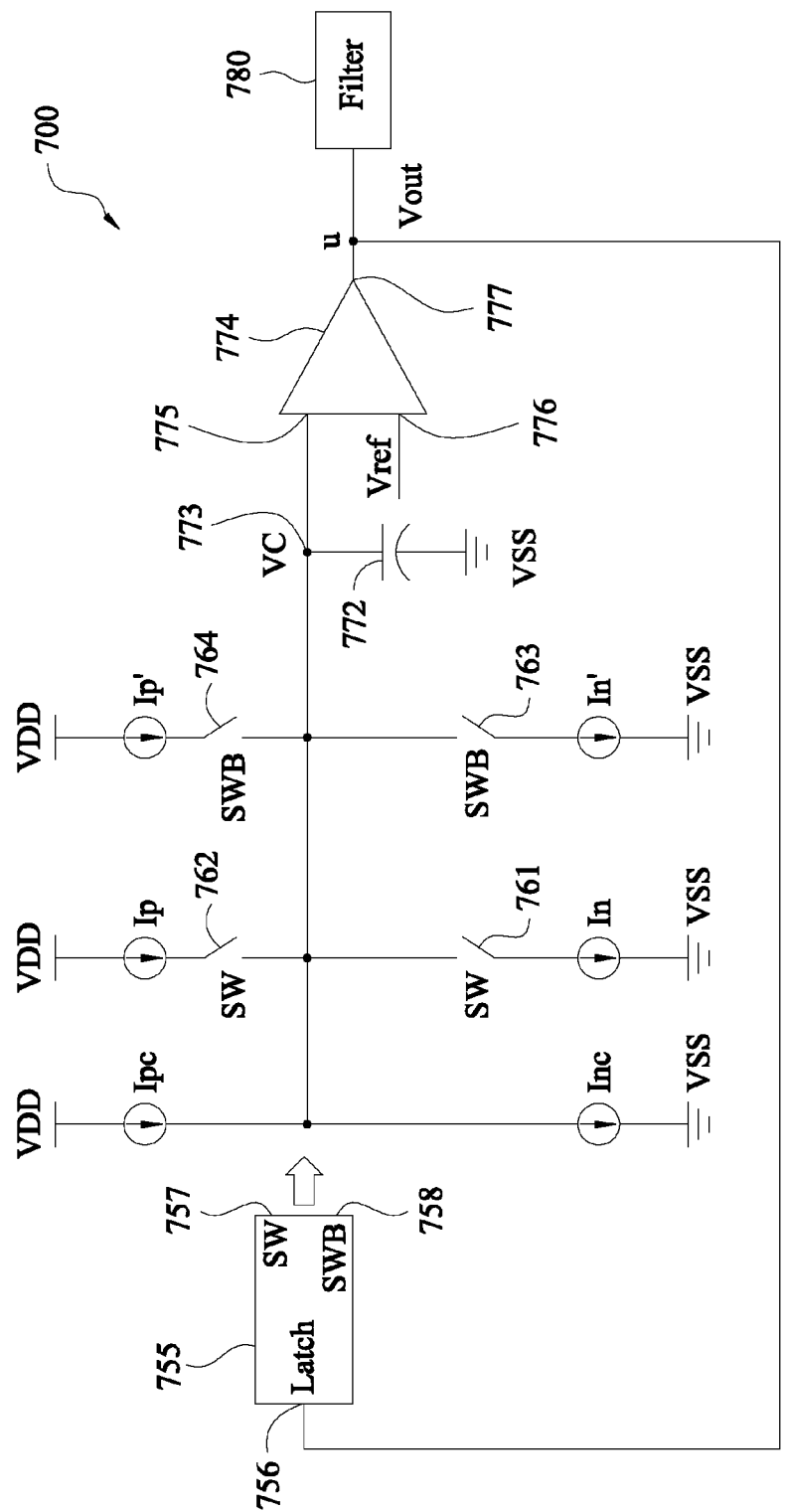
FIG. 7 is a schematic circuit diagram of a sensor in accordance with one or more embodiments.

FIG. 7 is a schematic circuit diagram of a sensor 700 in accordance with one or more embodiments. The sensor 700 comprises current sources Ipc, Inc, Ip, In, Ip', and In'. The sensor 700 further comprises a latch 755, switches 761, 762, 763, 764, a capacitor 772, a comparator 774 and a filter 780. The capacitor 772 has a terminal 773 coupled to a first input 775 of the comparator 774. The other terminal of the capacitor 772 is grounded. A second input 776 of the comparator 774 is coupled to receive a reference voltage Vref. An output 777 of the comparator 774 is coupled to an input 756 of the latch 755, and to the filter 780. In at least one embodiment, the latch 755, capacitor 772, comparator 774 and filter 780 correspond to the latch 55, capacitor 72, comparator 74 and digital filter 80 described herein. In at least one embodiment, the sensor 700 further comprises at least one of a control circuit corresponding to the temperature control circuit 85 or a reference voltage control circuit corresponding to the reference voltage control circuit 100. In at least one embodiment, the reference voltage Vref is a fixed voltage. In one or more embodiments, the reference voltage Vref is variable sufficiently slow within a counting/sensing window (of, e.g., 1024 clock pulses as described herein) and is considered as unchanged during the counting/sensing window.

A first current source In is coupled in series with a first switch 761 between a first voltage node VSS and the terminal 773 of the capacitor 772. A second current source Ipc is coupled between a second voltage node VDD and the terminal 773 of the capacitor 772. A third current source Inc is coupled between the terminal 773 of the capacitor 772 and the first voltage node VSS. A fourth current source Ip and a second switch 762 are coupled in series between the terminal 773 of the capacitor 772 and the second voltage node VDD. A fifth current source In' and a third switch 763 are coupled in series between the terminal 773 of the capacitor 772 and the first voltage node VSS. A sixth current source Ip' and a fourth switch 764 are coupled in series between the terminal 773 of the capacitor 772 and the second voltage node VDD. The current sources In, Ip, In', Ip' are parameter-independent current sources which are independent of a parameter to be sensed by the sensor 700. In at least one embodiment, a parameter-independent current source has a fixed current value. The current sources Inc, Ipc are parameter-dependent current sources which are dependent on the parameter, and have current values variable in response to variations of the parameter. Control terminals of the switches 761, 762 are coupled to a first output 757 of the latch 755 to receive a signal SW, and control terminals of the switches 763, 764 are coupled to a second output 758 of the latch 755 to receive a signal SWB. The signals SW and SWB are inverted signals of each other, and are generated based on the feedback signal Vout as described herein.

Current sources (or current signals as also referred to herein) Ipc and Inc are arranged to charge and discharge the capacitor 772, regardless of a level of the output voltage Vout (or feedback signal as described herein) outputted by the comparator 774. Current sources or current signals Ip and In are arranged to charge and discharge the capacitor 772, in response to a first level, e.g., a high level, of Vout which causes the latch 755 to output the signal SW to close the switches 761, 762. Current sources or current signals Ip' and In' are arranged to charge and discharge the capacitor 772, in response to a second level, e.g., a low level, of Vout which causes the latch 755 to output the signal SWB to close the switches 763, 764.

In at least one embodiment, one or more of the current sources Ipc, Inc, Ip, In, Ip', and In' and/or one or more corresponding switches 761-764 is/are omitted, provided that at least one parameter-independent current source and at least one parameter-dependent current source are included in the sensor 700. In the specific configuration illustrated in FIG. 7, a current source is on the charging side when the current source is connected to the voltage node VDD which provides a power supply voltage VDD, and a current source is on the discharging side when the current source is connected to the voltage node VSS which is the ground. For example, in one or more embodiments, the sensor 700 includes at least Ipc and any one or both of In and In'. In at least one embodiment, the sensor 700 includes Ipc and either of In and In', and has a configuration similar to that described with respect to FIG. 1. In one or more embodiments, the sensor 700 includes at least Inc, and any one or both of Ip and Ip'. In at least one embodiment, the sensor 700 includes Inc and either of Ip and Ip', and has a configuration similar to that described with respect to FIG. 4. In one or more embodiments, the sensor 700 includes multiple current sources which, in combination, provide any one of the current sources Ipc, Inc, Ip, In, Ip', and In'. For example, the sensor 700 in at least one embodiment includes two or more parameter-dependent current sources together defining Ipc.

Figure 6:
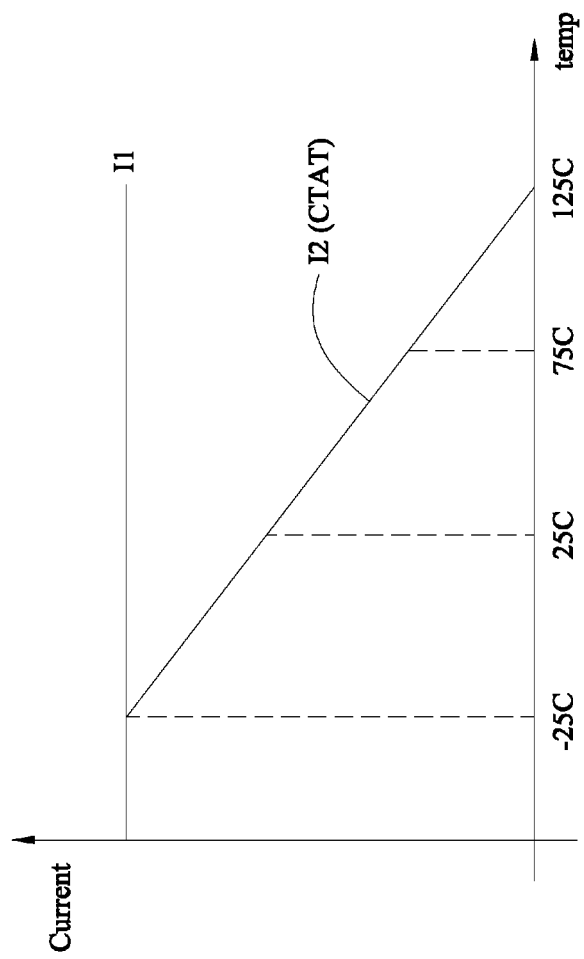
FIG. 6 is a graph showing a specific example of determining an output of a thermal sensor in accordance with one or more embodiments.

Operation of the sensor 700 is similar to that described with respect to FIGS. 1, 4 and 6. According to one or more embodiments, pulse density u of the output voltage Vout is determined based on the following equation:

$$t1[-1*Inc+1*Ipc-1*In+1*Ip]+(T-t1)*[-1*Inc+1*Ipc-1*In'+1*Ip']=0$$

where T corresponds to a repeat cycle time; t1 corresponds to the ON time of the output voltage Vout, and (T−t1) corresponds to the OFF time of the output voltage Vout. The pulse density u is a ratio of the ON time t1 to the cycle time T. By replacing t1/T with u in the above equation, the following relationship is obtained:

$$u = \frac{(Ip' - In') + (Ipc - Inc)}{(Ip' - In') - (Ip - In)}$$

In some embodiments, $$u = \frac{\sum(Ip' - In') + \sum(Ipc - Inc)}{\sum(Ip' - In') - \sum(Ip - In)}$$

where Σ(Ip'−In') denotes the sum of all parameter-independent current signals charging or discharging the capacitor 772 when Vout is at a low level, Σ(Ip−In) denotes the sum of all parameter-independent current signals charging or discharging the capacitor 772 when Vout is at a high level, and Σ(Ipc−Inc) denotes the sum of all parameter-dependent current signals charging or discharging the capacitor 772. In some embodiments, it is still possible to set all parameter-independent and/or parameter-dependent current signals according to the required detection function.

In some embodiments, by varying or selecting the number and/or current value of one or more of the current sources Ipc, Inc, Ip, In, Ip', and In', the calculation of pulse density u based on the described equations is changed to optimize one or more of sensitivity, accuracy and the like characteristics of the sensor 700.

In some embodiments the parameter to be detected is temperature, and the parameter-dependent current source Ipc or Inc is a temperature-dependent current source, such as a PTAT or CTAT current source as described herein. In at least one embodiment, the sensor 700 is configured to sense a parameter other than temperature. An example parameter (other than temperature) detectable by the sensor 700 in one or more embodiments includes internal routing resistance. For example, when a given voltage is applied to a circuit monitored by the sensor 700 in one or more embodiments, the sensor outputs a code representing a transferred current corresponding to the applied voltage. Based on the applied voltage and the outputted code representing the transferred current, the internal routing resistance of the circuit is determined. In at least one embodiment, the parameter-dependent current source Ipc or Inc is proportional or complementary to the detected value of the parameter. In some embodiments, the sensor 700 is configured to sense a parameter from a signal other than a current signal. For example, the sensor 700 is configured, in one or more embodiments, to convert a voltage signal or an optical signal to a current signal before sensing a parameter from the converted current signal.

Figure 8A:
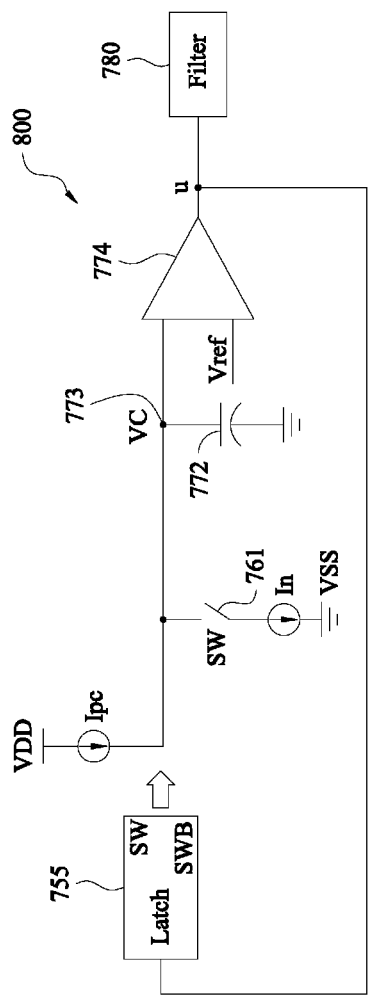
FIG. 8A is a schematic circuit diagram of a sensor in accordance with one or more embodiments.
Figure 8B:
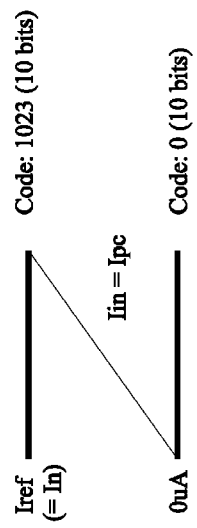
FIG. 8B is a graph showing a specific example of determining an output of the sensor in accordance with one or more embodiments.

FIG. 8A is a schematic circuit diagram of a sensor 800 in accordance with one or more embodiments, and FIG. 8B is a graph showing a specific example of determining an output of the sensor 800 in accordance with one or more embodiments. The sensor 800 is a configuration obtained by omitting the current sources Inc, Ip, Ip' and In' and the corresponding switches 762, 763, and 764 from the sensor 700. In at least one embodiment, the sensor 800 corresponds to the sensor 50 described with respect to FIG. 1, with Ipc and In corresponding to I2 and I1. The pulse density u in the sensor 800 is calculated by the following equation $$u = \frac{Ipc}{In} = \frac{Iin}{Iref}$$

where Iin is an input current equal to Ipc, and Iref is a reference current equal to In.

As illustrated in FIG. 8B, the sensor 800 is configured to sense or detect current values of Iin from zero (corresponding to u=0) to Iref (corresponding to u=1). This means the sensor 800 is configured to sense or detect values of the parameter in a range from a first value corresponding to Iin=0 and u=0 to a second value corresponding to Iin=Iref and u=1. This range of detectable values of the parameter is represented by corresponding codes outputted by the filter 780. For example, in a 10-bit system as illustrated in FIG. 8B, the detectable values of the parameter are represented by a range from code 0 (corresponding to Iin=0 and u=0) to code 1023 (corresponding to Iin=Iref and u=1).

In some situations, the whole range of codes, e.g., from 0 to 1023, is not fully utilized. For example, when the parameter to be detected is the operational temperature of a semiconductor device, the current Iin is unlikely to be zero to have code 0, i.e., a non-zero current Iin corresponds to a non-zero code. As a result, code 0 and other codes in the lower part of the code range from 0 to 1023 are unlikely utilized.—When Iref is sufficiently large and corresponds to a high parameter value unlikely met in operation of the semiconductor device, the upper part of the code range is unlikely utilized. These situations are referred to as "partial code" situations, because a portion of the code range is not utilized. Some embodiments provide a sensor configured to address such "partial code" situations.

Figure 9A:
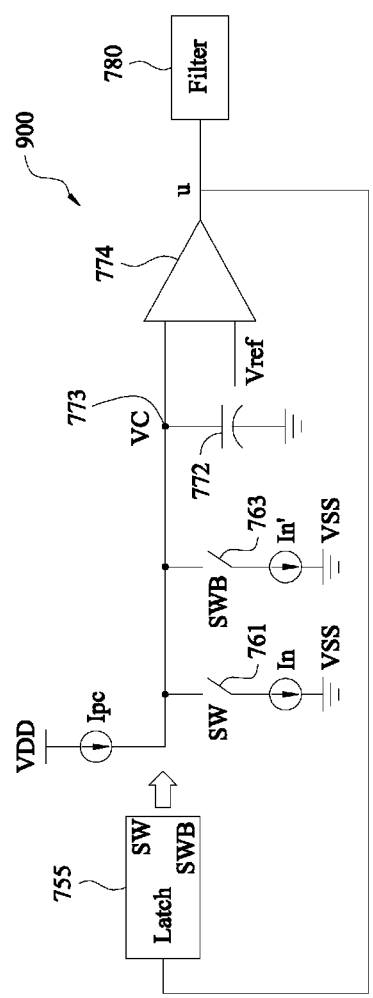
FIG. 9A is a schematic circuit diagram of a sensor in accordance with one or more embodiments.
Figure 9B:
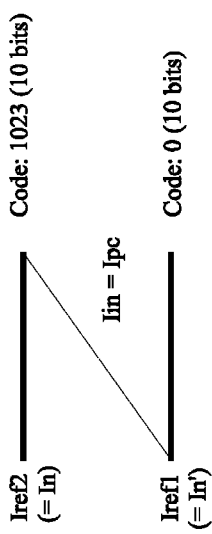
FIG. 9B is a graph showing a specific example of determining an output of the sensor in accordance with one or more embodiments.

FIG. 9A is a schematic circuit diagram of a sensor 900 in accordance with one or more embodiments, and FIG. 9B is a graph showing a specific example of determining an output of the sensor 900 in accordance with one or more embodiments. Compared to the sensor 800, the sensor 900 additionally includes the current source In' and the corresponding switch 763. The pulse density u in the sensor 900 is calculated by the following equation $$u = \frac{Ipc - In'}{In - In'} = \frac{Iin - Iref_1}{Iref_2 - Iref_1}$$

where Iin is an input current equal to Ipc, Iref1 is a first reference current equal to In', and Iref2 is a second reference current equal to In.

As illustrated in FIG. 9B, the sensor 900 is configured to sense or detect current values of Iin from Iref1 (corresponding to u=0) to Iref2 (corresponding to u=1). This means the sensor 900 is configured to sense or detect values of the parameter in a range from a first value corresponding to Iin=Iref1 and u=0 to a second value corresponding to Iin=Iref2 and u=1. This range of detectable values of the parameter is represented by corresponding codes outputted by the filter 780. For example, in a 10-bit system as illustrated in FIG. 9B, the detectable values of the parameter are represented by a range from code 0 (corresponding to Iin=Iref1 and u=0) to code 1023 (corresponding to Iin=Iref2 and u=1).

In some embodiments, by selecting Iref1 and/or Iref2 to correspond to a range of expected values of the parameter to be detected, the whole code range, e.g., from 0 to 1023 in a 10-bit system, is fully, or substantially fully, utilizable to achieve a "full code" arrangement. For the same code range, e.g., 1024 codes from 0 to 1023, a "partial code" arrangement covers a wide range of values including those unlikely met in practice, whereas a "full code" arrangement in accordance with one or more embodiments uses the same code range to cover a narrower range including mostly values expected in practice. As a result, the "full code" arrangement in accordance with one or more embodiments provides a sensor with increased sensitivity and/or accuracy.

Figure 10:
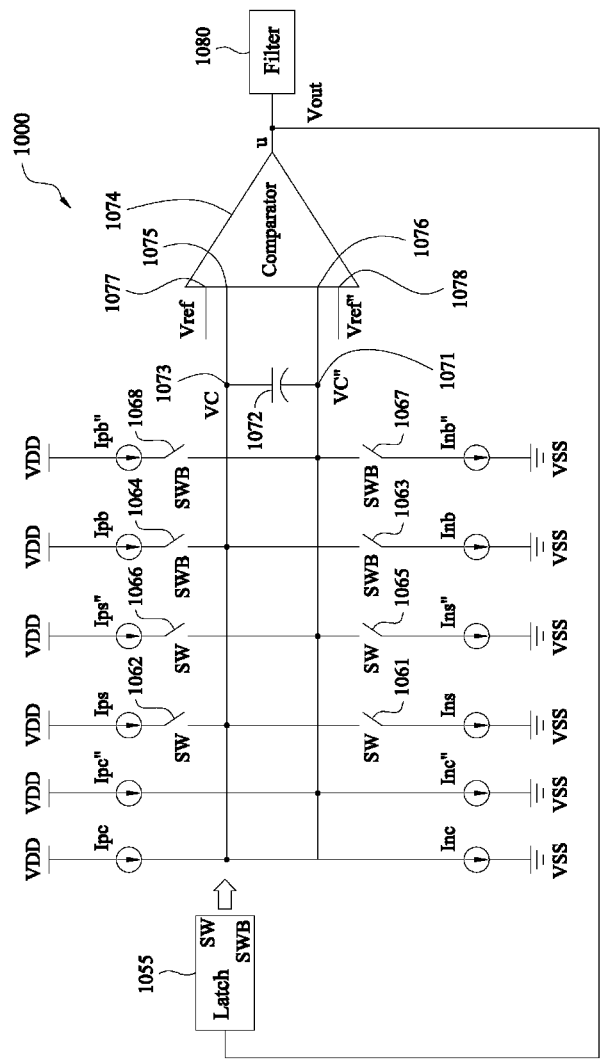
FIG. 10 is a schematic circuit diagram of a sensor in accordance with one or more embodiments.

FIG. 10 is a schematic circuit diagram of a sensor 1000 in accordance with one or more embodiments. The sensor 1000 comprises a latch 1055, a capacitor 1072, a differential comparator 1074 and a filter 1080. The capacitor 1072 has a first terminal 1073 coupled to a first input 1075 of the differential comparator 1074, and a second terminal 1071 coupled to a second input 1076 of the differential comparator 1074. A third input 1077 and a fourth input 1078 of the differential comparator 1074 are coupled to receive corresponding reference voltages Vref and Vref' to be compared by the differential comparator 1074 with corresponding voltages Vc and Vc" at the corresponding first terminal 1073 and second terminal 1071 of the capacitor 1072. ref. An output of the comparator 1074 is coupled to an input of the latch 1055, and to the filter 1080.

The sensor 1000 further comprises a first set of current sources including current sources Ipc, Inc, Ips, Ins, Ipb, and Inb, and switches 1061, 1062, 1063, 1064, coupled to the first terminal 1073 of the capacitor 1072 in a manner similar to that described with respect to corresponding current sources Ipc, Inc, Ip, In, Ip', and In' and switches 761, 762, 763, 764 in the sensor 700 in FIG. 7. The sensor 1000 further comprises a second set of current sources including current sources Ipc", Inc", Ips", Ins", Ipb", and Inb", and switches 1065, 1066, 1067, 1068, coupled to the second terminal 1071 of the capacitor 1072 in a manner similar to that described with respect to the connection of corresponding current sources Ipc, Inc, Ip, In, Ip', and In' and switches 761, 762, 763, 764 to the terminal 773 of the capacitor 772 in in the sensor 700 in FIG. 7.

In at least one embodiment, one or more of the current sources Ipc, Inc, Ips, Ins, Ipb, and Inb and one or more corresponding switches 1061, 1062, 1063, 1064 is/are omitted, provided that at least one parameter-independent current source and at least one parameter-dependent current source are coupled to the first terminal 1073 of the capacitor 1072, as described with respect to the sensor 700. In at least one embodiment, one or more of the current sources Ipc", Inc", Ips", Ins", Ipb", and Inb" and one or more corresponding switches 1065, 1066, 1067, 1068 is/are omitted, provided that at least one parameter-independent current source and at least one parameter-dependent current source are coupled to the second terminal 1071 of the capacitor 1072, as described with respect to the sensor 700.

The two sets of current sources and switches coupled to the corresponding two terminals 1073, 1071 of the capacitor 1072 define a differential mode arrangement. The operation of each set of current sources and corresponding switches is similar to that described with respect to FIG. 7. In some embodiments, one or more effects obtainable with the sensor 700 is/are achievable in the sensor 1000 with the differential mode arrangement. The differential mode arrangement of the sensor 1000, in some embodiments, eliminates common noise.

Figure 11:
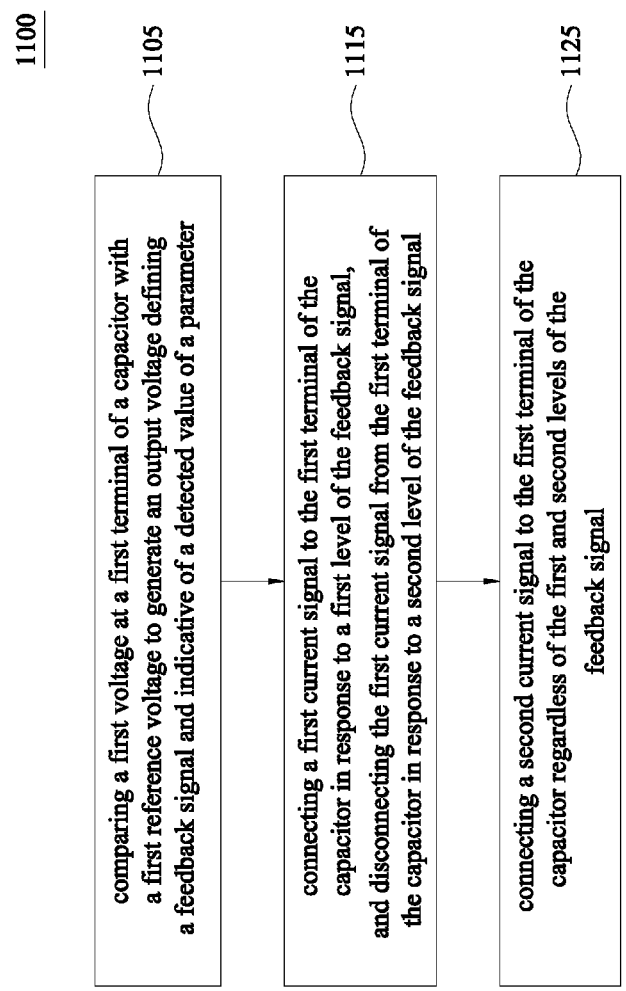
FIG. 11 is a flow chart of a method of sensing a value of a parameter in accordance with one or more embodiments.

FIG. 11 is a flow chart of a method 1100 of sensing a value of a parameter in accordance with one or more embodiments. In at least one embodiment, the method is performed by a sensor described with respect to FIGS. 7-10.

At operation 1105, a first voltage at a first terminal of a capacitor is compared with a first reference voltage to generate an output voltage defining a feedback signal and indicative of a detected value of a parameter. For example, a first voltage Vc at a first terminal 773 or 1073 of a capacitor 772 or 1072 is compared with a first reference voltage Vref to generate an output voltage Vout defining a feedback signal and indicative of a detected value of a parameter.

At operation 1115, a first current signal is connected to the first terminal of the capacitor in response to a first level of the feedback signal, and is disconnected from the first terminal of the capacitor in response to a second level of the feedback signal. The first current signal is independent of the parameter. For example, a first parameter-independent current signal In is connected to the first terminal 773 of the capacitor 772 in response to a first, e.g., high, level of the feedback signal that closes the switch 761, and is disconnected from the first terminal 773 of the capacitor 772 in response to a second, e.g., low, level of the feedback signal that opens the switch 761.

At operation 1125, a second current signal is connected to the first terminal of the capacitor regardless of the first and second levels of the feedback signal. The second current signal is dependent on the parameter. For example, a second, parameter-dependent current signal Ipc is connected to the first terminal 773 of the capacitor 772 regardless of whether the feedback signal is high or low, as illustrated in FIGS. 7-10.

In a further operation, a third current signal is connected to the first terminal of the capacitor in response to the second level of the feedback signal, and disconnected from the first terminal of the capacitor in response to the first level of the feedback signal. The third current signal is independent of the parameter. For example, a third, parameter-independent current signal In' is connected to the first terminal 773 of the capacitor 772 in response to the second, e.g., low, level of the feedback signal that closes the switch 763, and disconnected from the first terminal 773 of the capacitor 772 in response to the first, e.g., high, level of the feedback signal that opens the switch 763.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In summary, one or more embodiments provide a sensor configuration in which the number and/or current value of one or more parameter-independent and/or parameter-dependent current sources is/are selectable, for example, to optimize the sensor for an intended measurement range. As a result, at least one of sensitivity or accuracy of the sensor is improved in at least one embodiment. In some embodiments, a sensor having a differential mode arrangement is provided. As a result, common noise is eliminated or at least reduced in at least one embodiment, improving sensing accuracy. In some embodiments, the sensor is configured to sense not only temperature but also other parameters, providing a wide range of applications.

One or more embodiments include a sensor for sensing a parameter. The sensor comprises a capacitor, a switch and a comparator. The capacitor is configured to be charged or discharged by at least one of a first current signal or a second current signal. The switch is configured to selectively connect or disconnect the first current signal and the capacitor in response to a feedback signal. The comparator is coupled with the capacitor and configured to output an output voltage based on a comparison of a capacitor voltage of the capacitor to a reference voltage. The first current signal is independent of the parameter, and the second current signal is dependent on the parameter. The output voltage defines the feedback signal and is indicative of a value of the parameter detected by the sensor.

One or more embodiments include a sensor for sensing a parameter. The sensor comprises a capacitor having first and second terminals, a comparator, a latch, a first switch, a first current source, and a second current source. The comparator has a first input coupled to the first terminal of the capacitor, and an output. The latch has an input coupled to the output of the comparator, and a first output. The first switch has a control terminal coupled to the first output of the latch. The first current source is coupled in series with the first switch between a first voltage node and the first terminal of the capacitor. The first current source is independent of the parameter. The second current source is coupled between a second voltage node and the first terminal of the capacitor. The second current source is dependent on the parameter.

One or more embodiments include a method of sensing a value of a parameter. In the method, an output voltage is generated based on a first comparison of a first voltage at a first terminal of a capacitor with a first reference voltage. The output voltage defines a feedback signal and is indicative of the sensed value of the parameter. A first current signal is connected to the first terminal of the capacitor in response to a first level of the feedback signal, and disconnected from the first terminal of the capacitor in response to a second level of the feedback signal. A second current signal is connected to the first terminal of the capacitor regardless of the first and second levels of the feedback signal. The first current signal is independent of the parameter, and the second current signal is dependent on the parameter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sensor for sensing a parameter, the sensor comprising:
    a capacitor configured to be charged or discharged by at least one of a first current signal or a second current signal;
    a switch configured to selectively connect or disconnect the first current signal and the capacitor in response to a feedback signal;
    a comparator coupled with the capacitor and configured to output an output voltage based on a comparison of a capacitor voltage of the capacitor to a reference voltage; and
    a current source electrically coupled to the capacitor regardless of the output voltage,
    wherein
    the first current signal is independent of the parameter, and the second current signal is dependent on the parameter, and
    the output voltage defines the feedback signal and is indicative of a value of the parameter detected by the sensor.

2. The sensor of claim 1, further comprising:
    a digital filter coupled to the comparator and configured to receive and digitize the output voltage.

3. The sensor of claim 1, wherein the second current signal is proportional to the detected value of the parameter.

4. The sensor of claim 1, wherein the second current signal is complementary to the detected value of the parameter.

5. The sensor of claim 1, wherein
    the first current signal has a fixed current value, and
    the second current signal has a current value variable in response to variations of the parameter.

6. The sensor of claim 1, wherein
    the capacitor is configured to be charged or discharged by the first current signal and the second current signal in response to a first level of the feedback signal, and
    the capacitor is further configured to be discharged or charged by the second current signal in response to a second level of the feedback signal.

7. The sensor of claim 1, further comprising:
    a further switch configured to selectively connect or disconnect a third current signal and the capacitor in response to the feedback signal,
    wherein
    the capacitor is configured to be charged or discharged by the third current signal, and
    the third current signal is independent of the parameter.

8. The sensor of claim 7, wherein
    the switch is configured to
        connect the first current signal and the capacitor in response to a first level of the feedback signal, and
        disconnect the first current signal and the capacitor in response to a second level of the feedback signal, and
    the further switch is configured to
        disconnect the third current signal and the capacitor in response to the first level of the feedback signal, and
        connect the third current signal and the capacitor in response to the second level of the feedback signal.

9. The sensor of claim 7, wherein the first and third current signals have different fixed current values corresponding to upper and lower limits of a range of detectable values of the parameter.

10. The sensor of claim 7, wherein
the capacitor is configured to be charged or discharged by the first current signal and the second current signal in response to a first level of the feedback signal, and
the capacitor is further configured to be discharged or charged by the third current signal and the second current signal in response to a second level of the feedback signal.

11. A sensor for sensing a parameter, the sensor comprising:
a capacitor having first and second terminals;
a comparator having a first input coupled to the first terminal of the capacitor, and an output;
a latch having an input coupled to the output of the comparator, and a first output;
a first switch having a control terminal coupled to the first output of the latch;
a first current source coupled in series with the first switch between a first voltage node and the first terminal of the capacitor, the first current source independent of the parameter; and
a second current source coupled between a second voltage node and the first terminal of the capacitor, the second current source dependent on the parameter.

12. The sensor of claim 11, further comprising at least one of:
a third current source coupled between the first terminal of the capacitor and the first voltage node, the third current source dependent on the parameter;
a fourth current source and a second switch coupled in series between the first terminal of the capacitor and the second voltage node, the fourth current source independent of the parameter, the second switch having a control terminal coupled to the first output of the latch;
a fifth current source and a third switch coupled in series between the first terminal of the capacitor and the first voltage node, the fifth current source independent of the parameter, the third switch having a control terminal coupled to a second output of the latch; or
a sixth current source and a fourth switch coupled in series between the first terminal of the capacitor and the second voltage node, the sixth current source independent of the parameter, the fourth switch having a control terminal coupled to the second output of the latch.

13. The sensor of claim 11, wherein
the latch is configured to output a first output signal at the first output, and a second output signal at a second output, and
the second output signal is an inverted signal of the first output signal.

14. The sensor of claim 11, wherein
the second terminal of the capacitor is connected to a ground,
one of the first or second voltage nodes is the ground, and
the other of the first or second voltage nodes is a power supply voltage node.

15. The sensor of claim 11, further comprising:
a second switch having a control terminal coupled to one of the first output or a second output of the latch;
a third current source coupled in series with the second switch between the second terminal of the capacitor and one of the first or second voltage nodes, the third current source independent of the parameter; and
a fourth current source coupled between the second terminal of the capacitor and the other of the first or second voltage nodes, the fourth current source dependent on the parameter,
wherein the comparator has a second input coupled to the second terminal of the capacitor.

16. The sensor of claim 15, further comprising at least one of:
a fifth current source coupled between the first terminal of the capacitor and the first voltage node, the fifth current source dependent on the parameter;
a sixth current source and a third switch coupled in series between the first terminal of the capacitor and the second voltage node, the sixth current source independent of the parameter, the third switch having a control terminal coupled to the first output of the latch;
a seventh current source and a fourth switch coupled in series between the first terminal of the capacitor and the first voltage node, the seventh current source independent of the parameter, the fourth switch having a control terminal coupled to the second output of the latch; or
an eighth current source and a fifth switch coupled in series between the first terminal of the capacitor and the second voltage node, the eighth current source independent of the parameter, the fifth switch having a control terminal coupled to the second output of the latch.

17. The sensor of claim 16, further comprising at least one of:
a ninth current source coupled between the second terminal of the capacitor and said one of the first or second voltage nodes, the ninth current source dependent on the parameter;
a tenth current source and a sixth switch coupled in series between the second terminal of the capacitor and the other of the first or second voltage nodes, the tenth current source independent of the parameter, the sixth switch having a control terminal coupled to said one of the first or second outputs of the latch;
an eleventh current source and a seventh switch coupled in series between the second terminal of the capacitor and the other of the first or second voltage nodes, the eleventh current source independent of the parameter, the seventh switch having a control terminal coupled to the other of the first or second outputs of the latch; or
a twelfth current source and an eighth switch coupled in series between the second terminal of the capacitor and the other of the first or second voltage nodes, the twelfth current source independent of the parameter, the eighth switch having a control terminal coupled to the other of the first or second outputs of the latch.

18. A method of sensing a value of a parameter, said method comprising:
generating an output voltage based on a first comparison of a first voltage at a first terminal of a capacitor with a first reference voltage, the output voltage defining a feedback signal and indicative of the sensed value of the parameter;
connecting a first current signal to the first terminal of the capacitor in response to a first level of the feedback signal, and disconnecting the first current signal from the first terminal of the capacitor in response to a second level of the feedback signal; and connecting a second current signal to the first terminal of the capacitor regardless of the first and second levels of the feedback signal, wherein the first current signal is independent of the parameter, and the second current signal is dependent on the parameter.

19. The method of claim 18, further comprising:

connecting a third current signal to the first terminal of the capacitor in response to the second level of the feedback signal, and disconnecting the third current signal from the first terminal of the capacitor in response to the first level of the feedback signal.

20. The method of claim 18, further comprising:

connecting a third current signal to a second terminal of the capacitor in response to one of the first or second levels of the feedback signal, and disconnecting the third current signal from the second terminal of the capacitor in response to the other of the first or second levels of the feedback signal; and connecting a fourth current signal to the second terminal of the capacitor regardless of the first and second levels of the feedback signal, wherein the third current signal is independent of the parameter, and the fourth current signal is dependent on the parameter, and in said generating, the output voltage is generated further based on a second comparison of a second voltage at the second terminal of the capacitor with a second reference voltage.

* * * * *